United States Patent
Mu

(10) Patent No.: US 7,071,556 B2
(45) Date of Patent: Jul. 4, 2006

(54) TAPE BALL GRID ARRAY PACKAGE WITH ELECTROMAGNETIC INTERFERENCE PROTECTION AND METHOD FOR FABRICATING THE PACKAGE

(76) Inventor: Jinghui Mu, 3952 Bouquet Park La., San Jose, CA (US) 95135

( * ) Notice: Subject to any disclaimer, the term of this patent is extended or adjusted under 35 U.S.C. 154(b) by 0 days.

(21) Appl. No.: 10/938,836

(22) Filed: Sep. 10, 2004

(65) Prior Publication Data
US 2006/0055038 A1    Mar. 16, 2006

(51) Int. Cl.
*H01L 23/48* (2006.01)
*H01L 23/52* (2006.01)
*H01L 29/40* (2006.01)

(52) U.S. Cl. .................. 257/738; 257/707; 257/778

(58) Field of Classification Search ........ 257/706–707, 257/778–786, 737–738
See application file for complete search history.

(56) References Cited

U.S. PATENT DOCUMENTS

| 5,397,921 | A | 3/1995 | Karnezos | |
|---|---|---|---|---|
| 5,409,865 | A | 4/1995 | Karnezos | |
| 5,843,808 | A | 12/1998 | Karnezos | |
| 6,469,897 | B1 * | 10/2002 | Ho et al. | ............ 361/707 |
| 6,483,187 | B1 | 11/2002 | Chao et al. | |
| 2002/0063331 | A1 | 5/2002 | Honda | |

FOREIGN PATENT DOCUMENTS

WO    WO 98/25301    6/1998

* cited by examiner

*Primary Examiner*—Cuong Nguyen

(57) ABSTRACT

A tape ball grid array (TBGA) package and method for fabricating the package utilizes at least one electrical connection between a conductive stiffener and a patterned metal layer of a tape substrate, which is connected to a solder ball that is designated to be connected to AC ground, so that the conductive stiffener can be AC grounded. The electrical connection between the conductive stiffener and the AC ground-designated solder ball may be achieved by wirebonding the conductive stiffener to the patterned metal layer of the tape substrate. Since the conductive stiffener can be AC grounded, the conductive stiffener can be used as an electromagnetic interference (EMI) shield.

18 Claims, 4 Drawing Sheets

TAPE BALL GRID ARRAY PACKAGE WITH ELECTROMAGNETIC INTERFERENCE PROTECTION AND METHOD FOR FABRICATING THE PACKAGE

BACKGROUND OF THE INVENTION

Integrated circuit (IC) chips are becoming more complex with increased circuit density and higher input/output (I/O) counts. In order to accommodate these IC chips, different types of IC packages have been developed, such as tape ball grid array (TBGA) packages, chip scale packages and flip chip packages. Of these different types of IC packages, TBGA packages have become popular due to their low cost and ease of manufacture.

A conventional TBGA package of interest comprises a tape substrate, an IC chip, and a conductive stiffener. The tape substrate includes at least one dielectric layer and one or more patterned metal layers. The patterned metal layers are typically used for signal transmission and AC signal ground connection. The patterned metal layers are electrically connected to the IC chip via wirebonds. In order to physically and electrically connect the TBGA package to a printed circuit board (PCB), the TBGA package utilizes a number of solder balls that are selectively connected to the patterned layers of the tape substrate. These solder balls are used to attach the TBGA package directly to a PCB or indirectly to the PCB via a socket, and to electrically connect the patterned metal layers of the tape substrate (and thus, the IC chip) to the circuitry on the PCB. The IC chip and the tape substrate are attached to the conductive stiffener, which provides structural support and electrical connection. The conductive stiffener is typically AC signal grounded or floated.

When the conductive stiffener of the TBGA package is AC signal grounded, the conductive stiffener generates electromagnetic signal into the surrounding environment, and thus, creates electromagnetic interference (EMI) to other electrical components near the TBGA package. In addition, the TBGA package is itself susceptible to EMI caused by electromagnetic field from the surrounding environment.

One technique to protect the TBGA package from EMI is to connect the conductive stiffener to AC ground, rather than to AC signal ground, so that the conductive stiffener can be used as an EMI shield. The two current methods to connect the conductive stiffener of a TBGA package to AC ground are (1) electrically connecting the conductive stiffener to the IC chip using first wirebonds and electrically connecting the IC chip to a patterned metal layer of the tape substrate using second wirebonds such that the conductive stiffener is electrically connected to the solder balls designated to be connected to AC ground via the first wirebonds, the IC chip, the second wirebonds and the patterned metal layer, and (2) electrically connecting the AC ground-designated solder balls directly to the conductive stiffener using apertures through the tape substrate.

A concern with the first method to connect the conductive stiffener to AC ground is that the method requires a significant amount of pad space on the IC chip and numerous wirebonds between the IC chip and the tape substrate. Another concern with the first method is that long electrical paths are created between the conductive stiffener to the AC ground-designated solder balls since each signal path includes one of the first wirebonds and one of the second wirebonds.

A concern with the second method to connect the conductive stiffener to AC ground is that this method requires a special packaging process to attach the AC ground-designated solder balls to the conductive stiffener using the apertures through the tape substrate.

Consequently, there is a need for a TBGA package with EMI protection and method for fabricating the TBGA package that alleviates some or all of the above-described concerns.

SUMMARY OF THE INVENTION

A tape ball grid array (TBGA) package and method for fabricating the package utilizes at least one electrical connection between a conductive stiffener and a patterned metal layer of a tape substrate, which is connected to a solder ball that is designated to be connected to AC ground, so that the conductive stiffener can be AC grounded. The electrical connection between the conductive stiffener and the AC ground-designated solder ball may include a wirebond. Since the conductive stiffener can be AC grounded, the conductive stiffener can be used as an electromagnetic interference (EMI) shield.

A TBGA package in accordance with an embodiment of the invention comprises a conductive supporting structure, an integrated circuit chip attached to the conductive supporting structure, a substrate attached to the conductive supporting structure, the substrate including a patterned metal layer and a dielectric layer, the patterned metal layer being electrically connected to the integrated circuit chip, and a direct electrical connection between the conductive supporting structure and the patterned metal layer.

A TBGA package in accordance with another embodiment of the invention comprise a metal stiffener with a recessed region, an integrated circuit chip attached to the metal stiffener at the recessed region, a tape substrate attached to the metal stiffener, the tape substrate including a patterned metal layer and a dielectric layer, the pattern metal layer being electrically connected to the integrated circuit chip via a first wirebond, the patterned metal layer further being electrically connected to the metal stiffener via a second wirebond, and a plurality of solder balls attached to the tape substrate, some of the solder balls being electrically connected to the patterned metal layer of the tape substrate such that the metal stiffener is electrically connected to at least one of the solder balls through the second wirebond and the patterned metal layer A method for fabricating a TBGA package in accordance with an embodiment of the invention comprises providing a conductive supporting structure, an integrated circuit chip and a substrate, attaching the integrated circuit chip and the substrate to the conductive supporting structure, electrically connecting the integrated circuit chip to a patterned metal layer of the substrate, electrically connecting the conductive supporting structure to the patterned metal layer of the substrate via a direct electrical connection, and attaching a plurality of solder balls to the substrate, including electrically connecting some of the solder balls to the patterned metal layer of the substrate.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 5 is a flow diagram of a method for fabricating a TBGA package in accordance with an embodiment of the invention.

DETAILED DESCRIPTION

Figure 1:
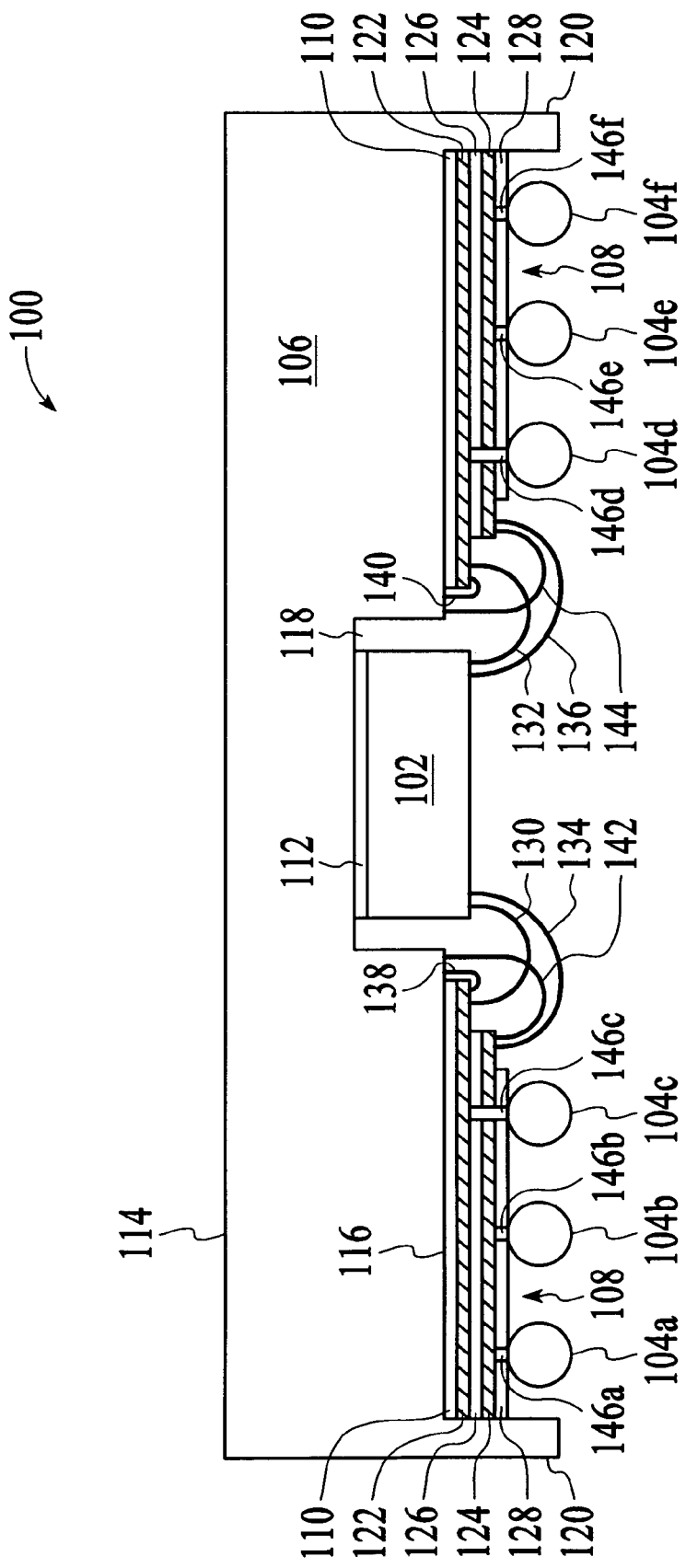
FIG. 1 is a cross-sectional view of a tape ball grid array (TBGA) package in accordance with an embodiment of the invention.

With reference to FIG. 1, a tape ball grid array (TBGA) package 100 in accordance with an embodiment of the invention is described. The TBGA package 100 allows an integrated circuit (IC) chip 102 to be electrically and physically attached to a printed circuit board (PCB) in an efficient manner via a number of solder balls 104. As described in more detail below, the TBGA package 100 includes a conductive stiffener 106 that can be connected to AC ground, which is separate from AC signal ground. The TBGA package 100 does not require a special packaging process, as is the case in some conventional TBGA packages with a conductive stiffener that can also be connected AC ground. Furthermore, when compared to comparable conventional TBGA packages, the TBGA package 100 has shorter electrical paths between the conductive stiffener 106 and the solder balls 104 designated to be connected to AC ground, and requires a fewer number of electrical connections and a fewer number of pads on the IC chip 102 to connect the conductive stiffener to the AC ground-designated solder balls. In an exemplary embodiment, the conductive stiffener 106 is designed to provide an effective electromagnetic interference (EMI) shield when the TBGA package 100 is mounted onto a PCB.

As shown in FIG. 1, which is a cross-sectional view, the TBGA package 100 includes the conductive stiffener 106, a tape substrate 108, the IC chip 102, and the solder balls 104. The solder balls 104 are attached to the tape substrate 108, which is attached to the conductive stiffener 106 by a layer of adhesive material 110, such as a layer of epoxy. Thus, the tape substrate 108 is situated between the solder balls 104 and the conductive stiffener 106. The IC chip 102 is directly attached to the conductive stiffener 106 by an adhesive material 112, preferably a thermally conductive material, such as epoxy. The TBGA package 100 is designed to be mounted onto a PCB by attaching the solder balls 104 to electrical contacts on a PCB or on a socket of the PCB.

The conductive stiffener 106 of the TBGA package 100 provides structural support for the IC chip 102, the tape substrate 108 and the solder balls 104 that are attached to the tape substrate 108. Thus, the conductive stiffener 106 can be viewed as a supporting structure for the entire TBGA package 100. The conductive stiffener 106 also provides heat dissipation, especially the heat from the IC chip 102. Therefore, the conductive stiffener 106 functions as a heatsink. The conductive stiffener 106 also provides AC ground electrical connection when the conductive stiffener is AC grounded. Thus, the conductive stiffener 106 is preferably made of a sturdy material that is both electrically conductive and thermally conductive, such as copper or other comparable metallic material.

The conductive stiffener 106 has an exposed surface 114 and an inner surface 116. The exposed surface 114 of the conductive stiffener 106 will be the top surface of the TBGA package 100 when the package is mounted onto a PCB. The inner surface 116 of the conductive stiffener 106 is the surface on which the tape substrate 108 and the IC chip 102 are attached to the conductive stiffener. As illustrated in FIG. 1, the conductive stiffener 106 includes a recessed region 118 on the inner surface 116. The recessed region 118 is designed to accommodate the IC chip 102. The IC chip 102 is attached to the conductive stiffener 106 at the recessed region 118 by the adhesive material 112.

Figure 2:
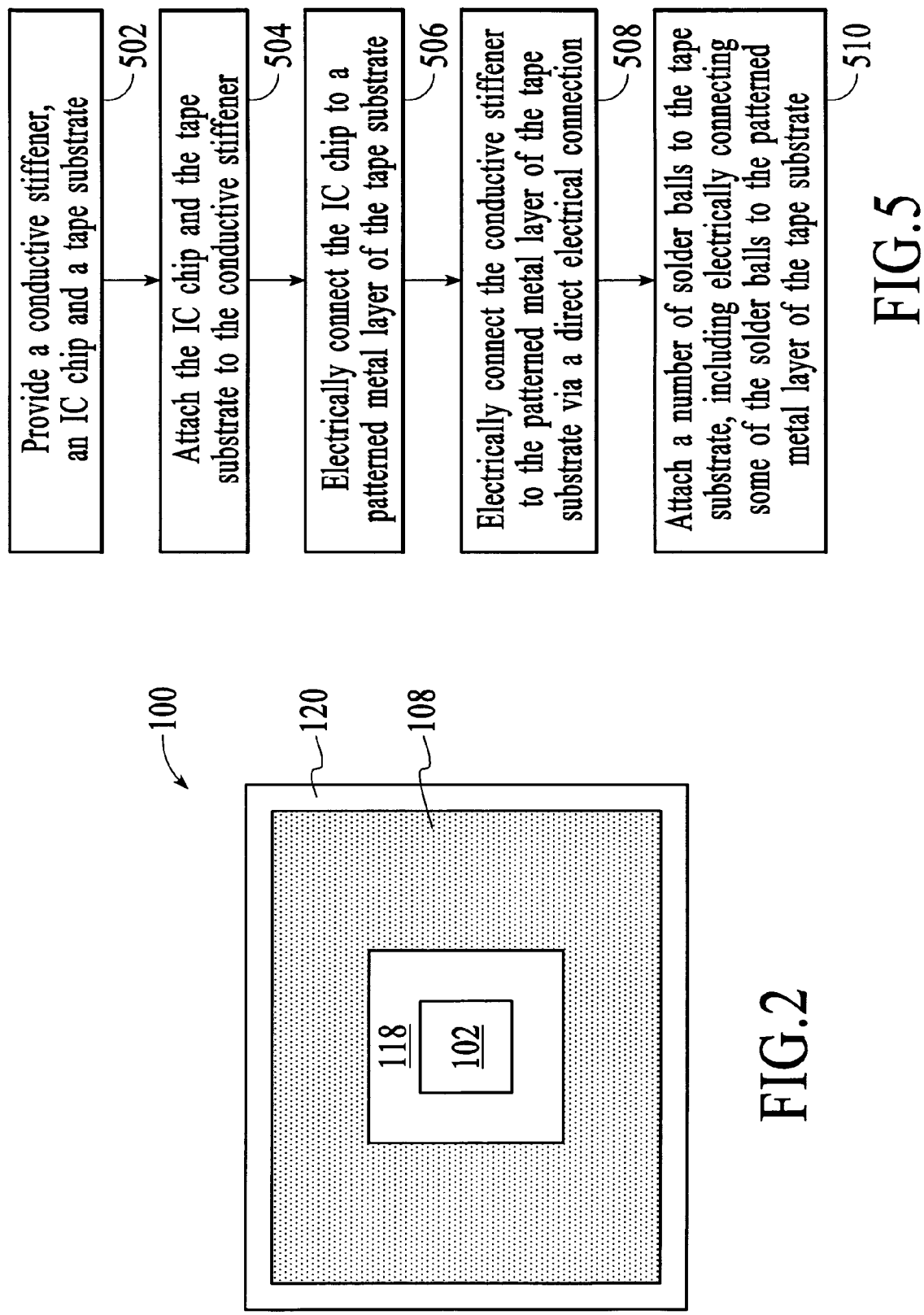
FIG. 2 is a bottom view of the TBGA package of FIG. 1.

In the exemplary embodiment, the conductive stiffener 106 includes a protruding member 120 located on the inner surface 116. Thus, the protruding member 120 is on the same side of the conductive stiffener 106 on which the IC chip 102 and the tape substrate 108 are attached. The protruding member 120 surrounds an area in which the IC chip 102 and the tape substrate 108 are located. Thus, the protruding member 120 forms a wall around the IC chip 102 and the tape substrate 108, as illustrated in FIG. 2, which is a bottom view of the TBGA package 100. FIG. 2 only shows the protruding member 120 of the conductive stiffener 106, the tape substrate 108 and the IC chip 102. The solder balls 104 and other components or features of the TBGA package 100 are not illustrated in FIG. 2. The protruding member 120 of the conductive stiffener 106 is shown in FIGS. 1 and 2 to be located on the edges of the inner surface 116. However, the protruding member 120 of the conductive stiffener 106 may be located at some distance from the edges of the inner surfaces 116.

Figure 3:
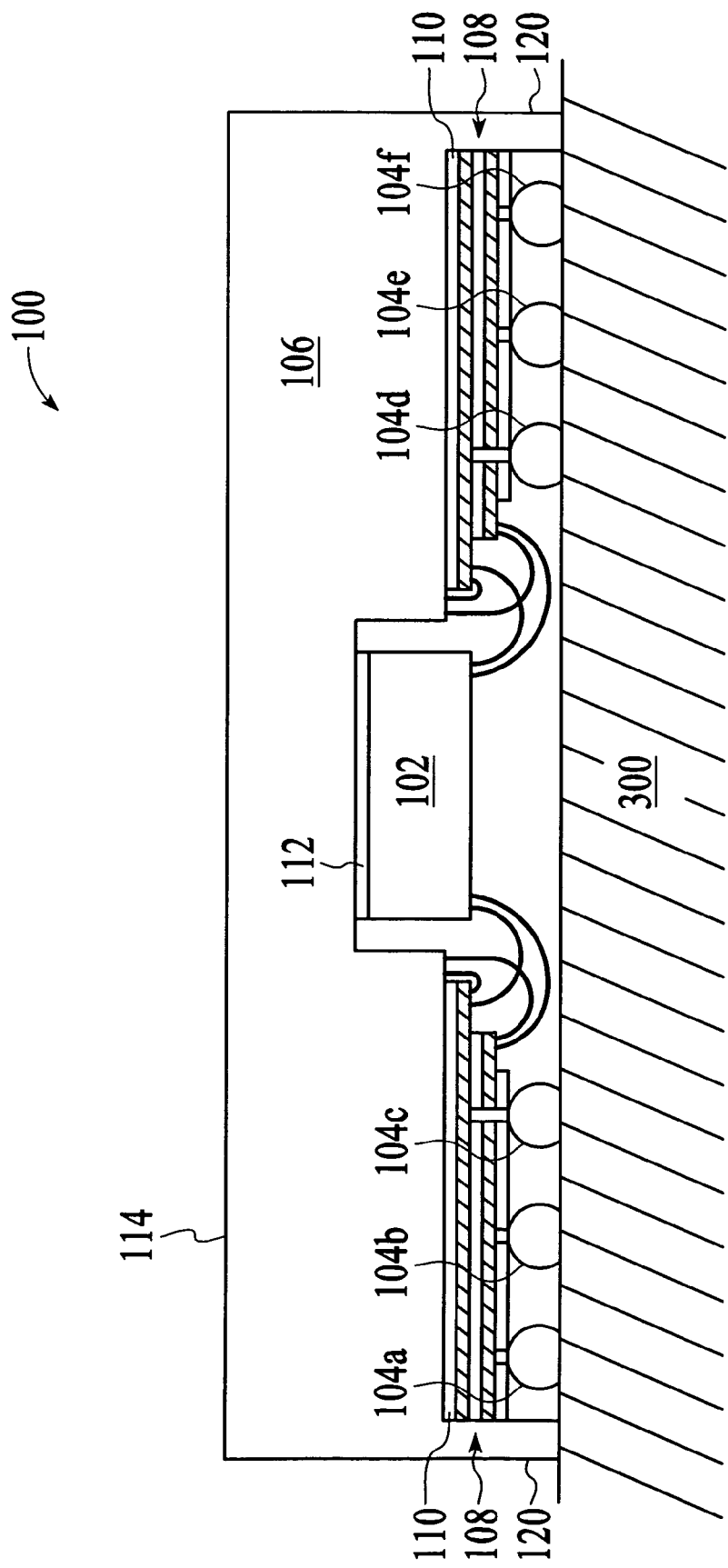
FIG. 3 shows the TBGA package of FIG. 1 mounted onto a printed circuit board (PCB).

As illustrated in FIG. 3, the protruding member 120 allows the conductive stiffener 106 to substantially enclose the IC chip 102 and the tape substrate 108 over a PCB 300 when the TBGA package 100 is mounted onto the PCB. In FIG. 3, some of the reference numerals for the components of the TBGA package 100 are not shown to provide a more clear illustration. When the solder balls 104 are reflowed to attach the TBGA package 100 onto the PCB 300, the protruding member 120 of the conductive stiffener 106 can contact or almost contact the surface of the PCB such that the IC chip 102 and the tape substrate 108 are substantially covered by the conductive stiffener. Thus, the height of the protruding member 120 should be at least the thickness of the tape substrate 108. Since the conductive stiffener 106 substantially covers the IC chip 102 and the tape substrate 108, when the conductive stiffener 106 is connected to AC ground, the conductive stiffener serves as an effective shield that protects the IC chip 102 and the tape substrate 108 from EMI.

Turning back to FIG. 1, the tape substrate 108 of the TBGA package 100 includes patterned metal layers 122 and 124, a dielectric layer 126 and a cover layer 128. The patterned metal layers 122 and 124 are used for AC signal ground connection and for signal transmission. As an example, the patterned metal layer 122 can be used for AC signal ground connection and the patterned metal layer 124 can be used for signal transmission. The patterned metal layers 122 and 124 provide electrical connections between the conductive stiffener 106, the IC chip 102 and the solder balls 104, as described in more detail below. The patterned metal layers 122 and 124 are made of electrically conductive material, such as copper. The dielectric layer 126 is positioned between the metal layers 122 and 124, and thus, provides electrical insulation between the metal layers. As an example, the dielectric layer 126 may be made of a polyimide material. The cover layer 128 is positioned between the metal layer 124 and the solder balls 104. The cover layer 128 is made of a dielectric material to provide electrical insulation for the patterned metal layer 124.

The patterned metal layers 122 and 124 of the tape substrate 108 are electrically connected to the IC chip 102, the conductive stiffener 106 and the solder balls 104. As illustrated in FIG. 1, the patterned metal layer 122 is electrically connected to the IC chip 102 by wirebonds 130 and 132, while the patterned metal layer 124 is electrically connected to the IC chip by wirebonds 134 and 136. Similarly, the patterned metal layer 122 is electrically connected to the conductive stiffener 106 by wirebonds 138 and 140, while the patterned metal layer 124 is electrically connected to the conductive stiffener by wirebonds 142 and 144.

The solder balls 104 are electrically connected to either the patterned metal layer 122 or the patterned metal layer 124 through apertures 146 in the tape substrate 108. These apertures 146 either extend through just the cover layer 128 of the tape substrate 108 or through the cover layer, the patterned metal layer 124 and the dielectric layer 126 of the tape substrate. In the illustrated embodiment, the solder balls 104a, 104b, 104e and 104f are electrically connected to the patterned metal layer 124 through the apertures 146a, 146b, 146e and 146f, respectively, and the solder balls 104c and 104d are electrically connected to the patterned metal layer 122 through the apertures 146c and 146d, respectively.

Although only four wirebonds 130, 132, 134 and 136 that provide electrical connections between the IC chip 102 and the patterned metal layers 122 and 124 are illustrated in FIG. 1, there are in fact many more wirebonds connected between the IC chip and the patterned metal layers, and consequently there are many more solder balls that the illustrated solder balls 104a–104f. The exact number of wirebonds connected between the IC chip 102 and the patterned metal layers 122 and 124 and the exact number of solder balls attached to the tape substrate 108 depend on the IC chip type and the application for which the TBGA package 100 is designed to be used. Similarly, although four wirebonds 138, 140, 142 and 144 that provide electrical connections between the conductive stiffener 106 and the patterned metal layers 122 and 124 are illustrated in FIG. 1, there may be fewer or more wirebonds connected between the conductive stiffener and the patterned metal layers.

The patterned metal layers 122 and 124 essentially function as electrical signal lines. Thus, the patterned metal layers 122 and 124 can selectively connect the wirebonds 130–144 to the solder balls 104. In the illustrated embodiment, the patterned metal layer 122 electrically connects the wirebonds 138 and 140 to the solder balls 104c and 104d, respectively. The patterned metal layer 124 electrically connects the wirebonds 142 and 144 to the solder balls 104b and 104e, respectively. The patterned metal layer 124 also electrically connects the wirebonds 134 and 136 to the solder balls 104a and 104f, respectively, for signal transmission between the solder balls 104a and 104f and the IC chip 102. Since the wirebonds 138, 140, 142 and 144 are connected to the conductive stiffener 106, the solder balls 104b, 104c, 104d and 104e are electrically connected to the conductive stiffener. The solder balls 104b, 104c, 104d and 104e are designated to be connected to AC ground. Therefore, the conductive stiffener 106 can be AC grounded by connecting the solder balls 104b, 104c, 104d and 104e to AC ground, which can be a board chassis.

Figure 4:
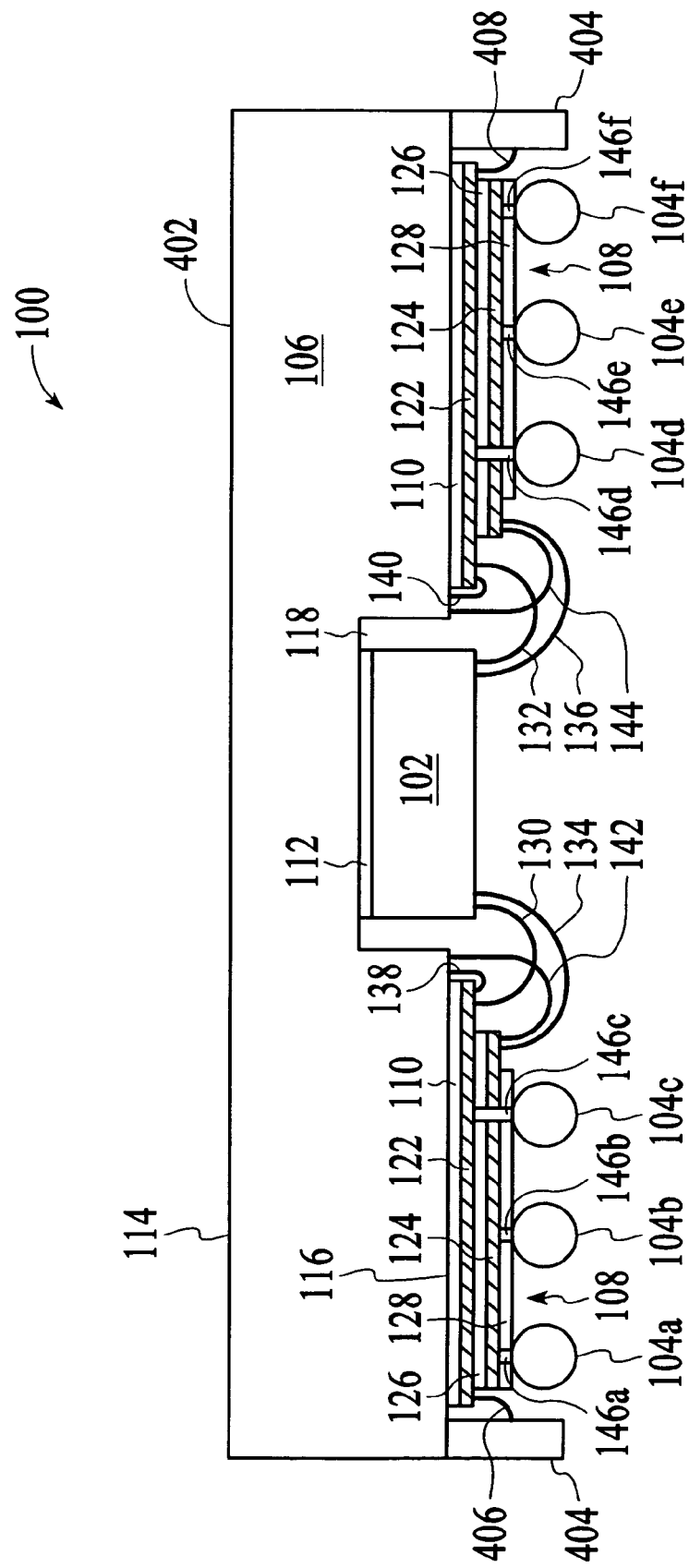
FIG. 4 is a cross-sectional view of a TBGA package in accordance with an alternative embodiment of the invention.

As illustrate in FIGS. 1 and 3, the protruding member 120 of the conductive stiffener 106 is an integrated part of the conductive stiffener. That is, the conductive stiffener 106 with the protruding member 120 is a single structural unit. However, in an alternative embodiment, the conductive stiffener 106 may be composed of separate structural components, as illustrated in FIG. 4. In this embodiment, the conductive stiffener 106 includes a main body 402 and a protruding member 404, which are separate structural components of the conductive stiffener. Since the protruding member 404 of the conductive stiffener 106 may not be electrically connected to the main body 402, the protruding member may be electrically connected to the patterned layer 122 and/or the patterned layer 124 of the tape substrate 108 via wirebonds so that the protruding member can also be AC grounded to provide EMI protection for the IC chip 102 and the tape substrate 108 when the TBGA package 100 is mounted onto a PCB. As an example, in FIG. 4, the protruding member 404 of the conductive stiffener 106 is electrically connected to the patterned metal layer 122 of the tape substrate 108 via wirebonds 406 and 408 such that the protruding member is electrically connected to the AC ground-designated solder balls 104c and 104d.

In conventional TBGA packages, the conductive stiffener is typically connected to AC ground-designated solder balls in one of two methods. The first method involves making apertures in the tape substrate that extend completely through the tape substrate and then forming the AC ground-designated solder balls on the apertures so that the solder balls electrically contact the conductive stiffener. The second method involves electrically connecting the conductive stiffener to the IC chip using first wirebonds and then electrically connecting the IC chip to a patterned metal layer of the tape substrate using second wirebonds, which is electrically connected to the AC ground-designated solder balls, such that the conductive stiffener is electrically connected to the AC ground-designated solder balls through the first wirebonds, the IC chip, the second wirebonds and the patterned metal layer of the tape substrate.

A concern with the first conventional method is that the method involves a special packaging process, which increases the complexity and cost for fabricating the TBGA packages. This concern is not applicable to the TBGA package 100 because the TBGA package 100 does not use such apertures in the tape substrate 106 to electrically connect the conductive stiffener 106 to the AC ground-designated solder balls 104b, 104c, 104d and 104e.

A concern with the second conventional method is that signal paths from the conductive stiffener to the AC ground-designated solder balls include the length of the first wirebonds and the length of the second wirebonds. Thus, the electrical bond length and impedance between the conductive stiffener and one of the patterned layers of the tape substrate in the conventional TBGA packages are significantly greater than the TBGA package 100, which uses only a single wirebond, rather than two wirebonds, to connect the conductive stiffener 106 to one of the patterned metal layers 122 and 124 of the tape substrate 108.

Another concern with the second conventional method is that, since the first and second wirebonds are connected to the IC chip, a single electrical connection between the conductive stiffener and an AC ground-designated solder ball requires two pads on the IC chip so that two wirebonds can be connected to the IC chip for each electrical connection between the conductive stiffener to one of the AC ground-designated solder balls. In contrast, the TBGA package 100 does not require these pads on the IC chip 102 to make electrical connections between the conductive stiffener 106 and the AC ground-designated solder balls 104b, 104c, 104d and 104e.

A method for fabricating a TBGA package in accordance with an embodiment of the invention is described with reference to the process flow diagram of FIG. 5. At block 502, a conductive stiffener, an IC chip and a tape substrate are provided. Next, at block 504, the IC chip and the tape substrate are attached to the conductive stiffener. Next, at block 506, the IC chip is electrically connected to a patterned metal layer of the tape substrate. In an exemplary embodiment, the IC chip is wirebonded to the patterned metal layer of the tape substrate using a number of wirebonds. Next, at block 508, the conductive stiffener is electrically connected to the patterned metal layer of the tape substrate via a direct electrical connection. In the exemplary embodiment, the metal stiffener is wirebonded to the patterned metal layer of the tape substrate using one or more wirebonds. Next, at block 510, a number of solder balls are attached to the tape substrate. The attaching of the solder balls to the tape substrate includes electrically connecting some of the solder balls to the patterned metal layer of the substrate. Since the conductive stiffener is electrically connected to some of the solder balls via the patterned metal layer of the tape substrate, the conductive stiffener can be AC grounded, for example, to a board chassis.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A tape ball grid array package comprising:
   a conductive supporting structure;
   an integrated circuit chip attached to the conductive supporting structure;
   a substrate attached to the conductive supporting structure, the substrate including a patterned metal layer and a dielectric layer, the patterned metal layer being electrically connected to the integrated circuit chip; and
   a direct electrical connection between the conductive supporting structure and the patterned metal layer,
   wherein the direct electrical connection is a wirebond connected between the conductive supporting structure and the patterned metal layer.

2. The package of claim 1 further comprising a second direct electrical connection between the conductive supporting structure and a second patterned metal layer of the substrate.

3. The package of claim 2 further comprising a plurality of solder balls attached to the substrate such that the substrate is situated between the solder balls and the conductive supporting structure, each of the solder balls being electrically connected to one of the patterned metal layer and the second patterned metal layer of the substrate.

4. The package of claim 1 wherein the conductive supporting structure includes a recessed region, the integrated circuit chip being attached to the conductive supporting structure at the recessed region.

5. The package of claim 1 wherein the conductive supporting structure includes a protruding member on the same side of the conductive supporting structure on which the integrated circuit chip is attached, the protruding member being configured to substantially surround the integrated circuit chip attached to the conductive supporting structure.

6. The package of claim 5 wherein the height of the protruding member of the conductive supporting structure is at least equal to the thickness of the substrate.

7. The package of claim 5 wherein the conductive supporting structure includes a main body and the protruding member, the protruding member being a separate structural component of the conductive supporting structure and the main body being another separate structural component of the conductive supporting structure.

8. The package of claim 7 wherein the protruding member is electrically connected to the patterned metal layer of the substrate.

9. A tape ball grid array package comprising:
   a metal stiffener with a recessed region;
   an integrated circuit chip attached to the metal stiffener at the recessed region;
   a tape substrate attached to the metal stiffener, the tape substrate including a patterned metal layer and a dielectric layer, the pattern metal layer being electrically connected to the integrated circuit chip via a first wirebond, the patterned metal layer further being electrically connected to the metal stiffener via a second wirebond; and
   a plurality of solder balls attached to the tape substrate, some of the solder balls being electrically connected to the patterned metal layer of the tape substrate such that the metal stiffener is electrically connected to at least one of the solder balls through the second wirebond and the patterned metal layer.

10. The package of claim 9 wherein the tape substrate includes a second patterned metal layer that is electrically connected to the metal stiffener by a third wirebond, some of the solder balls being electrically connected to the second patterned metal layer.

11. The package of claim 9 wherein the metal stiffener includes a protruding member on the same side of the metal stiffener as the recessed region, the protruding member being configured to substantially surround the integrated circuit chip at the recessed region of the metal stiffener.

12. The package of claim 11 wherein the height of the protruding member of the metal stiffener is at least equal to the thickness of the tape substrate.

13. The package of claim 12 wherein the metal stiffener includes a main body and the protruding member, the protruding member being a separate structural component of the metal stiffener and the main body being another separate structural component of the metal stiffener.

14. The package of claim 13 wherein the protruding member is electrically connected to the patterned metal layer of the tape substrate by a third wirebond.

15. A tape ball grid array package comprising:
   a conductive supporting structure;
   an integrated circuit chip attached to the conductive supporting structure;
   a substrate attached to the conductive supporting structure, the substrate including a patterned metal layer and a dielectric layer, the patterned metal layer being electrically connected to the integrated circuit chip; and
   a direct electrical connection between the conductive supporting structure and the patterned metal layer,
   wherein the conductive supporting structure includes a protruding member on the same side of the conductive supporting structure on which the integrated circuit chip, is attached, the protruding member being configured to substantially surround the integrated circuit chip attached to the conductive supporting structure.

16. The package of claim 15 wherein the height of the protruding member of the conductive supporting structure is at least equal to the thickness of the substrate.

17. The package of claim 15 wherein the conductive supporting structure includes a main body and the protruding member, the protruding member being a separate structural component of the conductive supporting structure and the main body being another separate structural component of the conductive supporting structure.

18. The package of claim 17 wherein the protruding member is electrically connected to the patterned metal layer of the substrate.

* * * * *